(12) United States Patent
Migita

(10) Patent No.: US 10,128,294 B2
(45) Date of Patent: Nov. 13, 2018

(54) LIGHT-RECEIVING DEVICE ARRAY AND LIGHT-RECEIVING APPARATUS

(71) Applicant: SUMITOMO ELECTRIC INDUSTRIES, LTD., Osaka (JP)

(72) Inventor: Masaki Migita, Fujisawa (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/723,786

(22) Filed: Oct. 3, 2017

(65) Prior Publication Data

US 2018/0151617 A1    May 31, 2018

(30) Foreign Application Priority Data

Nov. 28, 2016 (JP) ................................. 2016-230201

(51) Int. Cl.
| | |
|---|---|
| *H01L 31/00* | (2006.01) |
| *H01L 27/146* | (2006.01) |
| *H01L 31/0352* | (2006.01) |
| *H01L 31/0304* | (2006.01) |

(52) U.S. Cl.
CPC .. *H01L 27/14634* (2013.01); *H01L 27/14605* (2013.01); *H01L 27/14607* (2013.01); *H01L 27/14618* (2013.01); *H01L 27/14636* (2013.01); *H01L 27/14643* (2013.01); *H01L 31/035236* (2013.01); *H01L 31/03046* (2013.01)

(58) Field of Classification Search
None
See application file for complete search history.

(56) References Cited

U.S. PATENT DOCUMENTS 6,147,349 A * 11/2000 Ray ........................ H01L 31/103
 250/338.4
2016/0197214 A1* 7/2016 Balasekaran ....... H01L 27/1464
 257/21

FOREIGN PATENT DOCUMENTS

WO    2005-026671    3/2005

* cited by examiner

*Primary Examiner* — Reema Patel
(74) *Attorney, Agent, or Firm* — Smith, Gambrell & Russell, LLP.

(57) ABSTRACT

A light-receiving apparatus includes: a light-receiving device array including a semiconductor structure including a plurality of semiconductor mesas, a plurality of grooves each of which defines one of the semiconductor mesas, a plurality of first electrodes disposed on upper surfaces of the semiconductor mesas, a plurality of first bump electrodes disposed on the first electrodes, and a metal body disposed on a bottom surface of at least one of the grooves, the metal body being spaced apart from the first electrodes and the first bump electrodes; a semiconductor device processing an electric signal from the light-receiving device array; and an underfill disposed between the light-receiving device array and the semiconductor device. The metal body is spaced apart from a surface of the semiconductor device. The semiconductor device is joined to the light-receiving device array through the first bump electrodes.

14 Claims, 10 Drawing Sheets

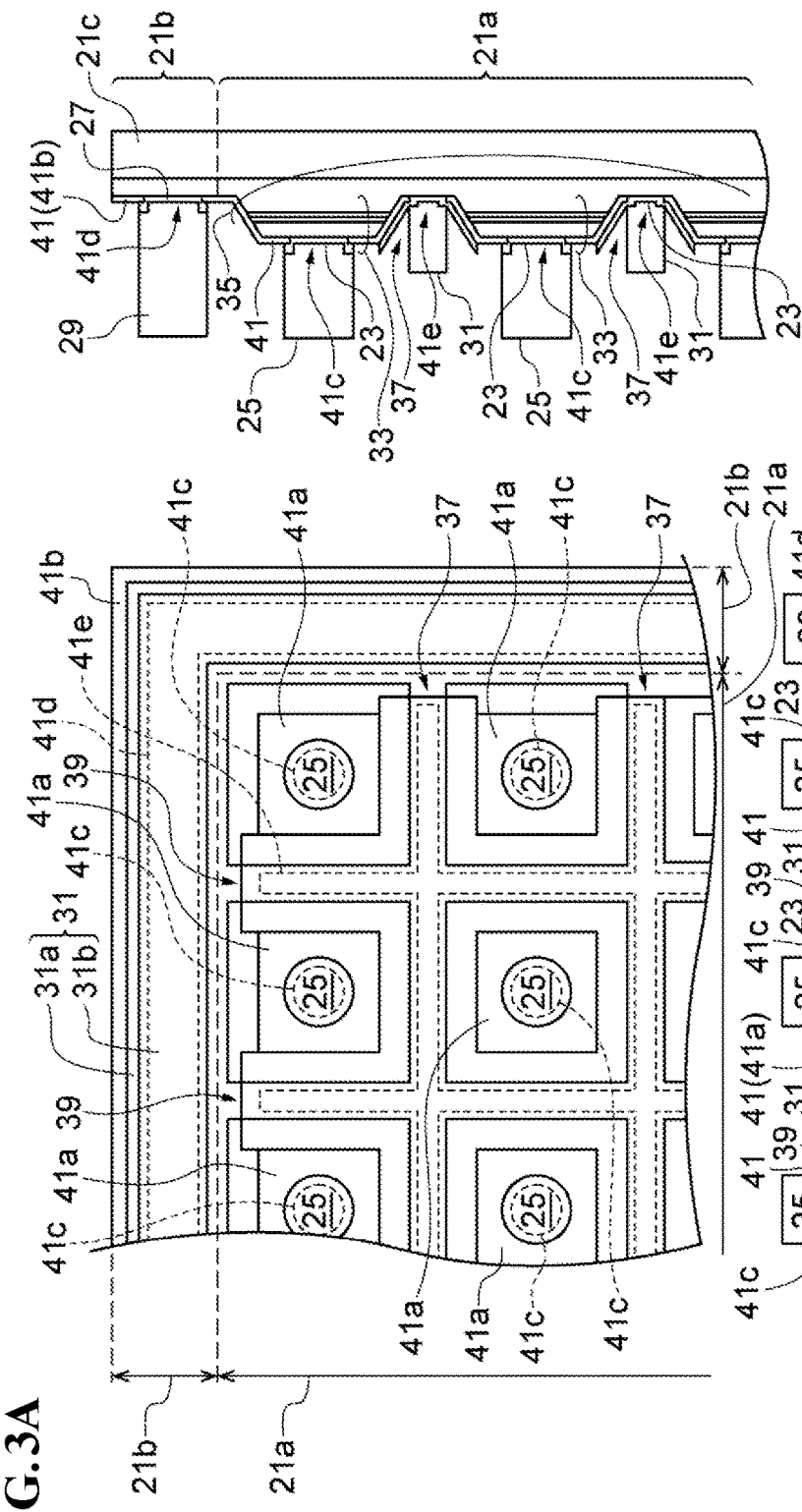
FIG.3A
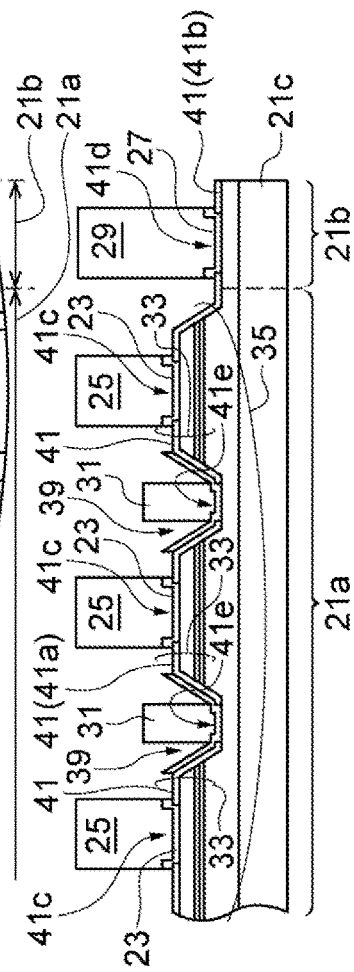
FIG.3B
FIG.3C

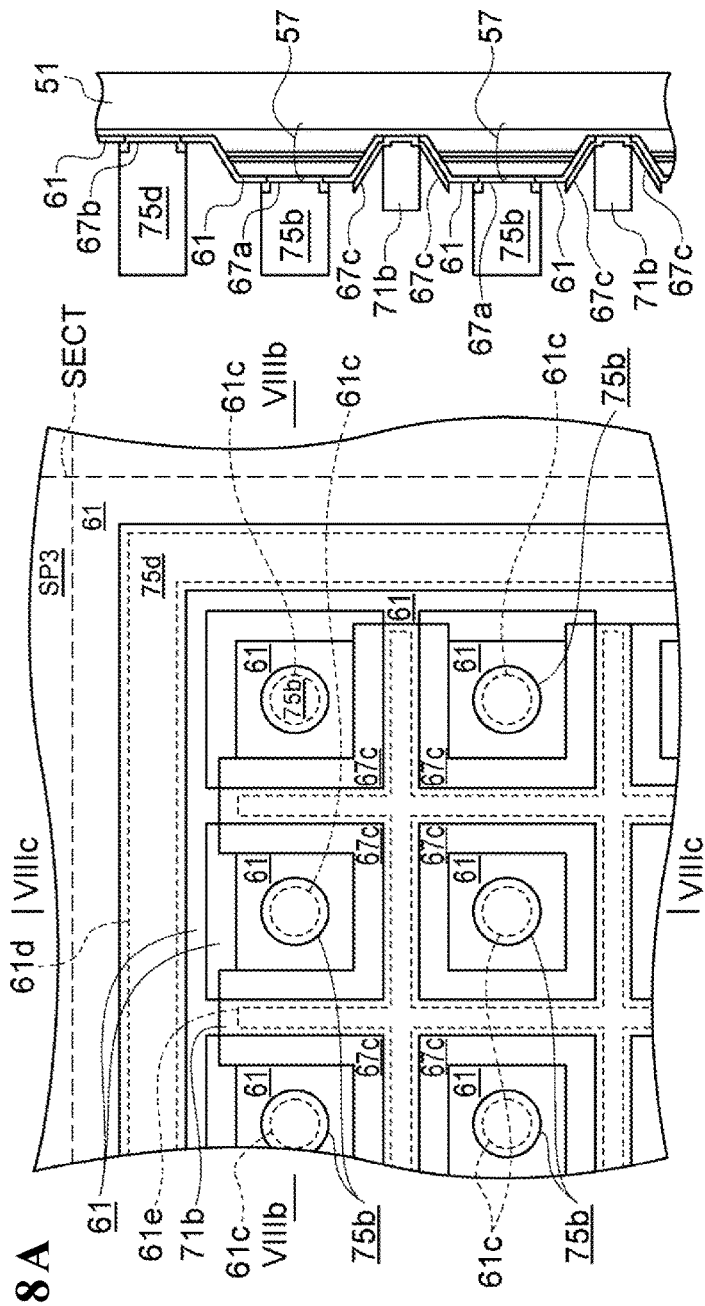
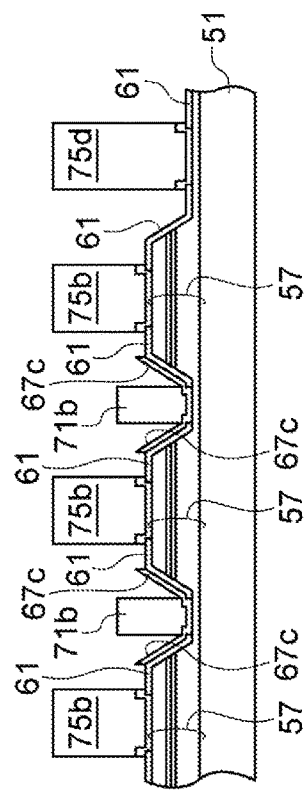
FIG.8A
FIG.8B
FIG.8C

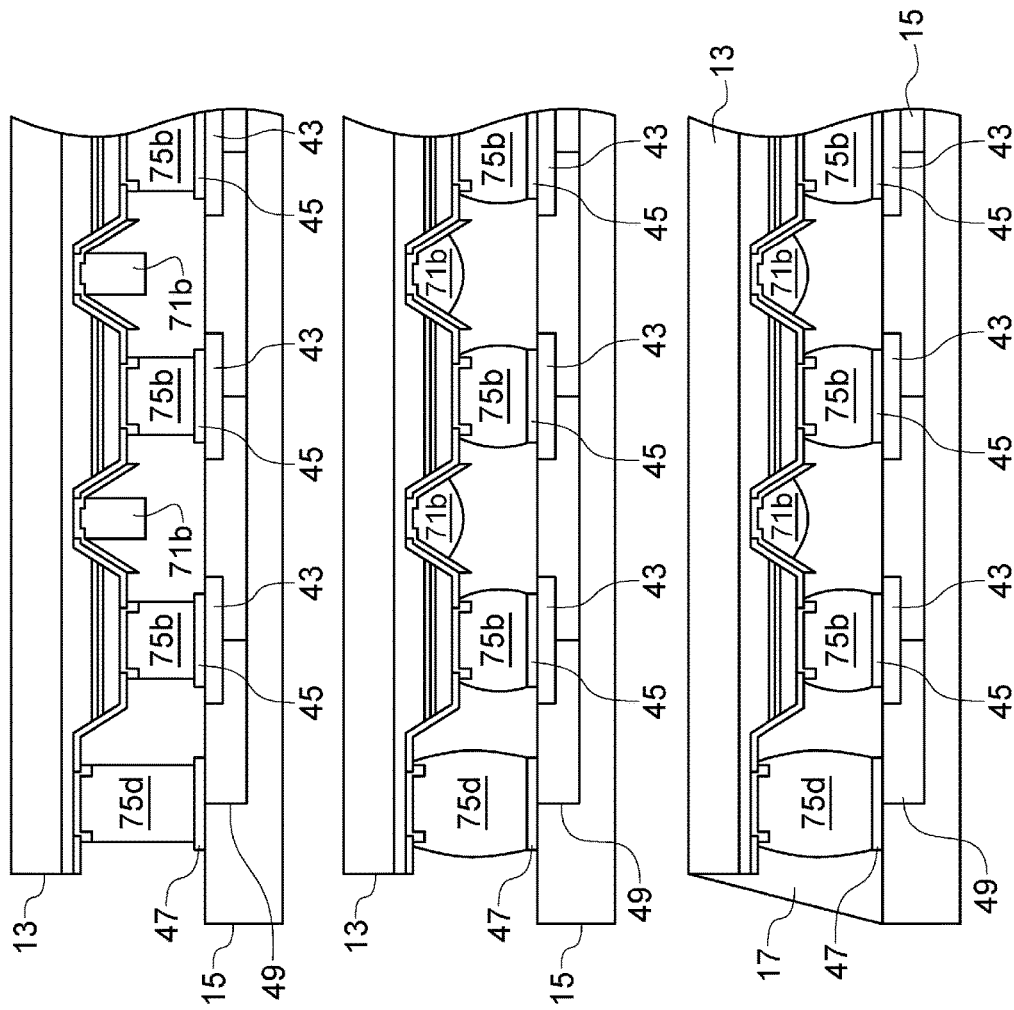

LIGHT-RECEIVING DEVICE ARRAY AND LIGHT-RECEIVING APPARATUS

BACKGROUND OF THE INVENTION

1. Field of the Invention

The present invention relates to a light-receiving device array and to a light-receiving apparatus.

2. Description of the Related Art

Patent document 1 (WO2005-026671) discloses a focal plane array having a type-II super-lattice structure including compound semiconductors.

A photo sensor having a type-II super-lattice structure includes a plurality of photodiodes arranged in an array on a principal surface of a substrate. The photodiodes detect, for example, light incident on the rear surface of the substrate. The photodiodes arranged in the array are connected to a silicon integrated circuit device so as to form a light-receiving apparatus. In the connection between the photodiodes and the silicon integrated circuit device, a bump electrode formed on a surface of each photodiode is used. The silicon integrated circuit device is disposed on a principal surface of a silicon (Si) substrate. The silicon integrated circuit device processes electric signals outputted from the plurality of photodiodes included in the photo sensor.

SUMMARY OF THE INVENTION

In the light-receiving apparatus, the photodiodes in the photo sensor is disposed so as to face the silicon integrated circuit device. The photodiodes and the silicon integrated circuit device are connected to each other through the bump electrodes formed on the photodiodes. A space between the photodiodes in the photo sensor and the silicon integrated circuit device is filled with an underfill that is made of resin. The underfill has a thermal expansion coefficient different from those of the semiconductor devices including the photodiode in the photo sensor and the silicon integrated circuit device. The difference in thermal expansion coefficient between the underfill and the semiconductor devices causes thermal stress to be applied to the semiconductor devices. In particular, the semiconductor device (photodiode) included in the photo sensor is cooled to low temperature during operation and therefore tends to be influenced by the thermal stress. Therefore, it is important to reduce the influence of the thermal stress caused by the underfill on the semiconductor devices, specifically on the semiconductor device (photodiode) included in the photo sensor. When the underfill extends in a predetermined direction, the underfill is thermally deformed in the predetermined direction. When the underfill has a large length and/or a large thickness, the thermal deformation in the extending direction becomes large. Therefore, for the light-receiving apparatus in which the underfill has a large thickness and/or a large length in a predetermined direction, it is particularly important to reduce the influence of the thermal stress on the semiconductor devices.

A light-receiving apparatus according to one aspect of the present invention includes: a light-receiving device array including a semiconductor structure including a pixel region and a peripheral region different from the pixel region, the semiconductor structure in the pixel region including a plurality of semiconductor mesas, a plurality of grooves each of which defines one of the semiconductor mesas, a plurality of first electrodes disposed on upper surfaces of the semiconductor mesas, a plurality of first bump electrodes disposed on the first electrodes, and a metal body disposed on a bottom surface of at least one of the grooves, the metal body being spaced apart from the first electrodes and the first bump electrodes; a semiconductor device processing an electric signal from the light-receiving device array; and an underfill disposed between the light-receiving device array and the semiconductor device. The metal body is spaced apart from a surface of the semiconductor device. In addition, the semiconductor device is joined to the light-receiving device array through the first bump electrodes.

A light-receiving device array according to another aspect of the present invention includes: a substrate including a pixel region and a peripheral region different from the pixel region; a plurality of semiconductor mesas disposed on the substrate in the pixel region; a plurality of grooves each of which defines one of the semiconductor mesas; a plurality of first electrodes disposed on upper surfaces of the semiconductor mesas; a plurality of first bump electrodes disposed on the first electrodes; and a metal body disposed on a bottom surface of at least one of the grooves. The metal body has a larger thickness than that of the first electrode. In addition, the metal body is spaced apart from the first electrodes and the first bump electrodes.

The above and other objects, features, and advantages of the present invention will be readily apparent from the following detailed description of the preferred embodiments of the invention with reference to the accompanying drawings.

BRIEF DESCRIPTION OF THE DRAWINGS

FIGS. 3A, 3B, and 3C are illustrations showing a light-receiving device array according to the embodiment.

FIGS. 8A, 8B, and 8C are illustrations showing key steps in the method for producing the light-receiving apparatus and the light-receiving device array according to the embodiment.

FIGS. 9A, 9B, and 9C are illustrations showing a key step in the method for producing the light-receiving apparatus and the light-receiving device array according to the embodiment.

DESCRIPTION OF THE PREFERRED EMBODIMENTS

Figure 1:
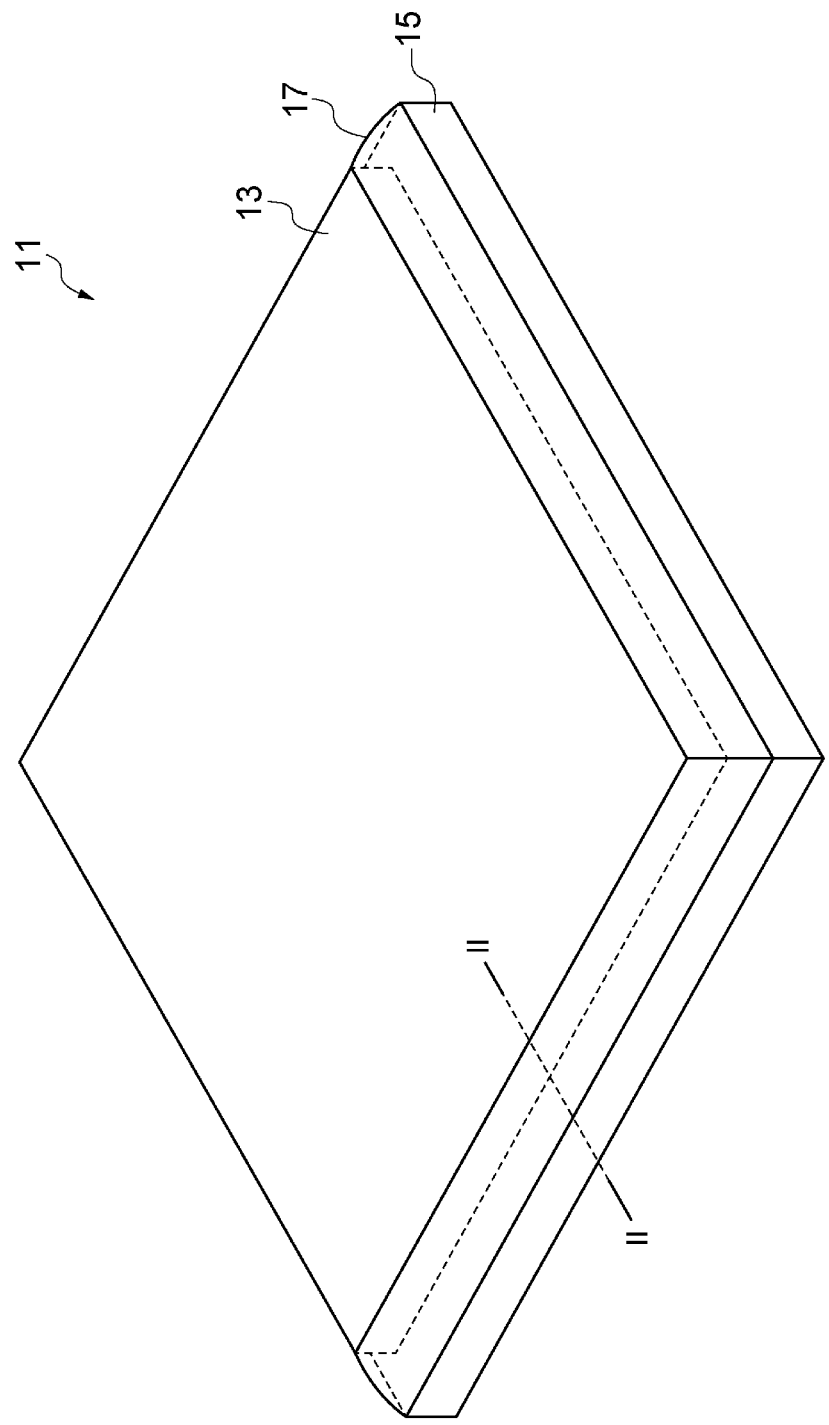
FIG. 1 is an illustration showing a light-receiving apparatus according to an embodiment.

Several embodiments will be described below.

A light-receiving apparatus according to an embodiment includes: (a) a light-receiving device array including a semiconductor structure including a pixel region and a peripheral region different from the pixel region, the semiconductor structure in the pixel region including a plurality of semiconductor mesas, a plurality of grooves each of which defines one of the semiconductor mesas, a plurality of first electrodes disposed on upper surfaces of the semiconductor mesas, a plurality of first bump electrodes disposed on the first electrodes, and a metal body disposed on a bottom surface of at least one of the grooves, the metal body being spaced apart from the first electrodes and the first bump electrodes; (b) a semiconductor device processing an electric signal from the light-receiving device array; and (c) an underfill disposed between the light-receiving device array and the semiconductor device. The metal body is spaced apart from a surface of the semiconductor device. In addition, the semiconductor device is joined to the light-receiving device array through the first bump electrodes.

In this light-receiving apparatus, the light-receiving device array has a structure that may reduce the influence of thermal stress caused by a difference in thermal expansion coefficients between the underfill and the semiconductor device or between the underfill and the light-receiving device array. Specifically, in this light-receiving device array, the metal body is disposed on the bottom surface of at least one of the grooves. The metal body in the grooves reduces the thickness of the underfill disposed between the light-receiving device array and the semiconductor device joined to the light-receiving device array. The metal body adjusts a thickness of the underfill within the grooves. Moreover, the metal body prevents the underfill in the grooves from extending over long distances along the bottom surfaces of the grooves. The metal body may adjust a thickness of the underfill within the grooves. When the underfill has a large length and/or a large thickness, the thermal deformation in the extending direction becomes large. Therefore, in the light-receiving apparatus, the influence of the thermal stress on the light-receiving device array and the semiconductor device may be effectively reduced.

In the light-receiving apparatus according to an embodiment, preferably, the metal body includes an underlying metal layer and a bump metal disposed on the underlying metal layer. The underlying metal layer is disposed on the bottom surface of the groove and on a side surface of the semiconductor mesa.

The light-receiving apparatus according to an embodiment may further include an insulating layer disposed on the semiconductor structure. Preferably, the metal body is disposed on the insulating layer. The insulating layer has openings each of which is located on one of the upper surfaces of the semiconductor mesas. Each of the first electrodes is disposed in one of the openings of the insulating layer. The first electrodes are in contact with the upper surfaces of the semiconductor mesas through the openings of the insulating layer.

In the light-receiving apparatus according to an embodiment, preferably, the semiconductor structure in the peripheral region includes a second electrode and a second bump electrode disposed on the second electrode, the second electrode being electrically connected to the semiconductor mesas. The insulating layer has an opening in the peripheral region. The second electrode is disposed in the opening of the insulating layer. The second electrode is in contact with an upper surface of the semiconductor structure in the peripheral region through the opening of the insulating layer.

In the light-receiving apparatus according to an embodiment, preferably, each of the first electrodes serves as one of an anode electrode and a cathode electrode. The second electrode serves as the other one of the anode electrode and the cathode electrode.

In the light-receiving apparatus according to an embodiment, preferably, the insulating layer has one or a plurality of openings disposed on the bottom surfaces of the grooves. The metal body is disposed in each of the openings of the insulating layer. In addition, the metal body is connected to the semiconductor structure in the pixel region through the opening of the insulating layer.

In the light-receiving device array in the light-receiving apparatus, the metal body is in contact with the semiconductor structure in the pixel region through the opening of the insulating layer. The metal body is firmly fixed to the semiconductor structure.

In the light-receiving apparatus according to an embodiment, preferably, the plurality of grooves includes a first groove extending in a first direction and a second groove extending in a second direction that crosses the first direction. The metal body disposed in the opening on the bottom surface of the first groove extends in the first direction. The metal body disposed in the opening on the bottom surface of the second groove extends in the second direction.

In the light-receiving device array in the light-receiving apparatus, the metal body may extend in the grooves extending in the first direction and the second direction that crosses the first direction.

In the light-receiving apparatus according to an embodiment, preferably, the semiconductor structure includes a substrate having a principal surface. The semiconductor mesas are disposed on the substrate. Each of the semiconductor mesas includes an optical absorption layer. In addition, the metal body has a smaller height from the principal surface of the substrate in a thickness direction than a height of the first bump electrode from the principal surface of the substrate in the thickness direction.

A light-receiving device array according to an embodiment includes: (a) a substrate including a pixel region and a peripheral region different from the pixel region; (b) a plurality of semiconductor mesas disposed on the substrate in the pixel region; (c) a plurality of grooves each of which defines one of the semiconductor mesas; (d) a plurality of first electrodes disposed on upper surfaces of the semiconductor mesas; (e) a plurality of first bump electrodes disposed on the first electrodes; and (f) a metal body disposed on a bottom surface of at least one of the grooves. The metal body has a larger thickness than that of the first electrode. In addition, the metal body is spaced apart from the first electrodes and the first bump electrodes.

The findings of the present invention can be easily understood by considering the following detailed description with reference to the attached drawings which are illustrated as examples. Embodiments of the light-receiving apparatus and the light-receiving device array will now be described with reference to the attached drawings. If possible, the same parts are designated by the same reference numerals.

Figure 2:
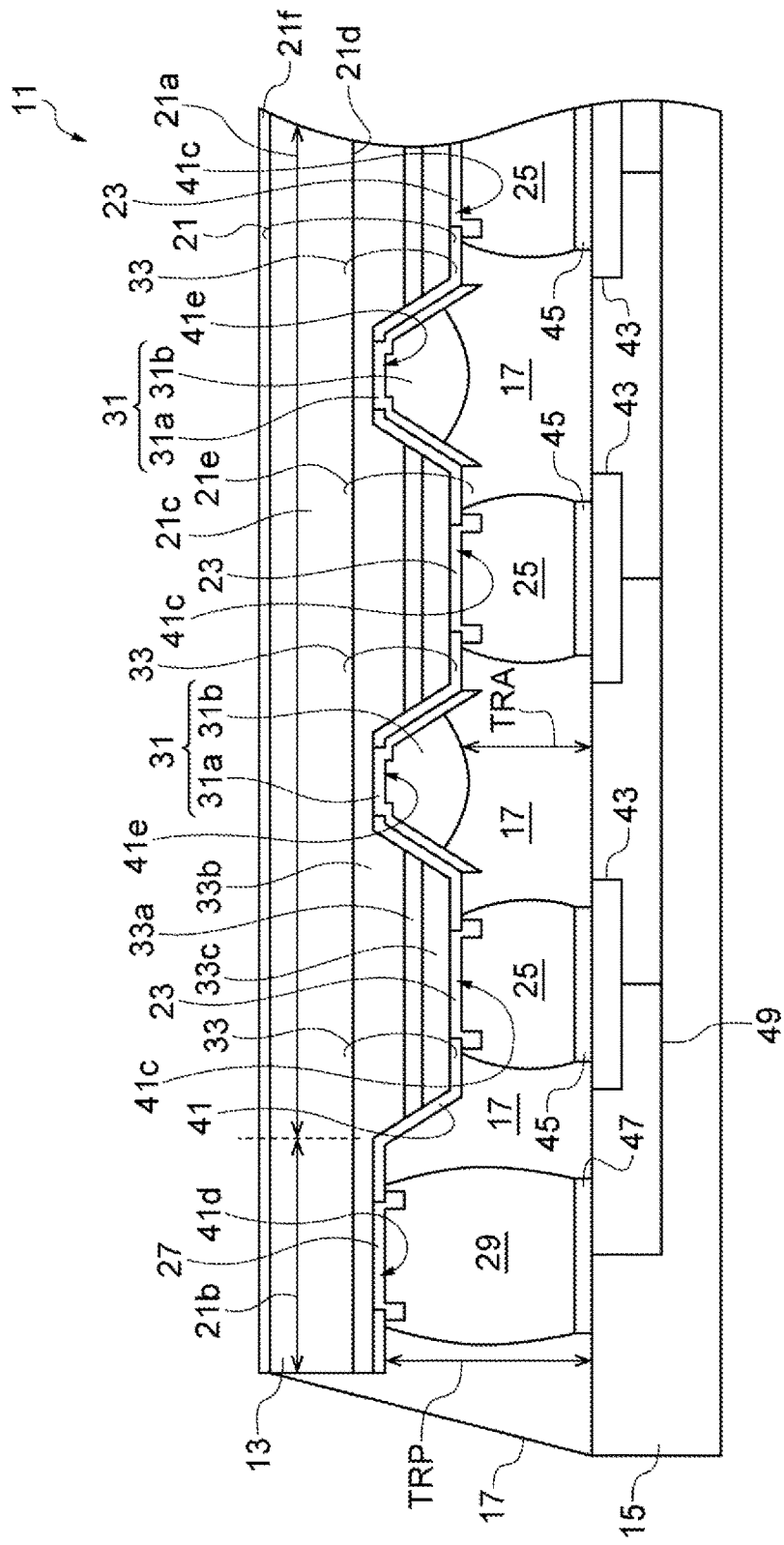
FIG. 2 is an illustration showing a cross section taken along line II-II in FIG. 1.

FIG. 1 illustrates a light-receiving apparatus according to one embodiment. FIG. 2 illustrates a cross section taken along line II-II in FIG. 1. FIGS. 3A, 3B, and 3C illustrate a light-receiving device array according to the present embodiment.

Referring to FIG. 1, the light-receiving apparatus 11 includes the light-receiving device array 13, a semiconductor device 15, and an underfill 17. As shown in FIG. 2, the underfill 17 is disposed between the light-receiving device array 13 and the semiconductor device 15. In addition, the underfill 17 is in contact with the light-receiving device array 13 and the semiconductor device 15. The underfill 17 is formed of a resin and contains, for example, an epoxy-based resin. The semiconductor device 15 is connected electrically and mechanically to the light-receiving device array 13 through bump electrodes including a first bump electrode 25 and a second bump electrode 29. Specifically, the semiconductor device 15 receives electric signals from the light-receiving device array 13, and processes the received electric signals. The light-receiving apparatus 11 converts a two-dimensional image of light to an electric signal and outputs the electric signal to the outside. The light-receiving device array 13 includes a plurality of light-receiving devices such as a photodiode having sensitivity to light with an infrared wavelength. For example, when the light-receiving device in the light-receiving device array 13 has a Type-II quantum well structure including a GaSb/InAs super-lattice, the light-receiving device has the sensitivity to light with a wavelength of 3 to 15 µm. To reduce a dark current of the light-receiving device, the light-receiving apparatus 11 is used at a temperature lower than room temperature, e.g., at a temperature equal to or lower than liquid nitrogen temperature (the boiling point of liquid nitrogen). Since the light-receiving apparatus 11 operates at the temperature lower than room temperature, the light-receiving apparatus 11 is cooled to its operating temperature and then returned to room temperature in a repetitive manner. The light-receiving device array 13, the semiconductor device 15, and the underfill 17 are each subjected to thermal stress due to the difference in their thermal expansion coefficients during temperature change. In the embodiment, the underfill 17 has a larger thermal expansion coefficient than that of the light-receiving device array 13 or the semiconductor device 15. The thermal deformation of the underfill 17 causes thermal stress to be applied to the light-receiving device array 13 and the semiconductor device 15.

FIG. 3A is a plan view showing the light-receiving device array for the light-receiving apparatus according to the present embodiment. FIG. 3B is a cross-sectional view taken along line IIIb-IIIb in FIG. 3A. FIG. 3C is a cross-sectional view taken along line IIIc-IIIc in FIG. 3A.

Referring to FIGS. 2, 3A, 3B, and 3C, the light-receiving device array 13 includes a semiconductor structure 21, first electrodes 23, first bump electrodes 25, a second electrode 27, a second bump electrode 29, and a metal body 31. The semiconductor structure 21 includes a pixel region 21a and a peripheral region 21b. In the present embodiment, the peripheral region 21b is disposed so as to surround the pixel region 21a. The semiconductor structure 21 includes a substrate 21c and a semiconductor stack 21e. The substrate 21c is arranged in the pixel region 21a and the peripheral region 21b. The semiconductor stack 21e is disposed on a principal surface 21d of the substrate 21c in the pixel region 21a and the peripheral region 21b. The substrate 21c is, for example, a semiconductor substrate. The semiconductor substrate is made of, for example, GaSb, InP, or GaAs. The pixel region 21a includes an array 35 including a plurality of semiconductor mesas 33 and further includes a plurality of first grooves 37 and a plurality of second grooves 39. The first grooves 37 extend in a first direction. The second grooves 39 extend in a second direction that crosses the first direction. In the present embodiment, first and second ends of each of the first grooves 37 reach the peripheral region 21b and are terminated. First and second ends of each of the second grooves 39 reach the peripheral region 21b and are terminated. The first grooves 37 and the second grooves 39 define the semiconductor mesas 33. The first grooves 37 and the second grooves 39 form a two-dimensional arrangement of the semiconductor mesas 33. In the array 35, the semiconductor mesas 33 are arranged in rows and columns. Each of the semiconductor mesas 33 includes an optical absorption layer 33a for generating photocurrent from incident light, a first conductive-type semiconductor region 33b, and a second conductive-type semiconductor region 33c. The first conductive-type semiconductor region 33b, the optical absorption layer 33a, and the second conductive-type semiconductor region 33c are disposed in this order on the principal surface 21d of the substrate 21c. The first electrodes 23 are electrically connected to the upper surfaces of the semiconductor mesas 33. Specifically, each of the first electrodes 23 is connected to a corresponding second conductive-type semiconductor region 33c that is a top layer of the semiconductor stack 21e in each of the semiconductor mesas 33. Each of the first electrodes 23 is provided on the pixel region 21a, and serves as one of an anode electrode and a cathode electrode that is disposed on the upper surface of a corresponding semiconductor mesa 33. The first bump electrodes 25 are mounted on the first electrodes 23. The metal body 31 is disposed on the bottom surfaces of the first grooves 37 or the second grooves 39 or both. The metal body 31 has a larger thickness than that of the first electrodes 23. The metal body 31 is spaced apart from the first electrodes 23 and the first bump electrodes 25.

Referring to FIG. 2, in the light-receiving apparatus 11, the metal body 31 is disposed on the bottom surfaces of the first grooves 37 or the second grooves 39 or both and also on side surfaces of the semiconductor mesas 33. Alternatively, the metal body 31 is disposed so as to fill spaces between adjacent semiconductor mesas 33.

In the light-receiving device array 13 of the light-receiving apparatus 11, the metal body 31 is disposed on the bottom surfaces of the first grooves 37 or the second grooves 39 or both and also on the side surfaces of the semiconductor mesas 33 so as to fill the grooves. The underfill 17 is disposed between the light-receiving device array 13 and the semiconductor device 15 connected to the light-receiving device array 13 through the first bump electrodes 25 and the second bump electrode 29. The underfill 17 is made of a material different from those of the light-receiving device array 13 and the semiconductor device 15. The underfill 17 is made of, for example, a resin. The underfill 17 has a thermal expansion coefficient that differs from the thermal expansion coefficients of the materials of the light-receiving device array 13 and from the thermal expansion coefficients of the materials of the semiconductor device 15. The metal body 31 adjusts a thickness of the underfill 17 within the grooves. Specifically, the metal body 31 locally reduces the thickness (TRA, TRP) of the underfill 17 within the grooves (the first grooves 37 and/or the second grooves 39). Moreover, the metal body 31 prevents the underfill 17 from extending over long distances along the first grooves 37 and the second grooves 39. 33. Referring to FIG. 2, in the present embodiment, thick portions of the underfill 17 are disposed so as to cover the peripheral region 21b, and thin portions of the underfill 17 are disposed so as to cover the pixel region 21a.

The first conductive-type semiconductor region 33b extends along the principal surface 21d of the substrate 21c and connects the semiconductor mesas 33 arranged in the array. The first conductive-type semiconductor region 33b further extends from the pixel region 21a to the peripheral region 21b. In the peripheral region 21b, the first conductive-type semiconductor region 33b is electrically connected to the second electrode 27. The second bump electrode 29 is mounted on the second electrode 27. The second electrode 27 is disposed on the first conductive-type semiconductor region 33b within the peripheral region 21b. The second electrode 27 serves as the other one of the anode electrode and the cathode electrode. The metal body 31 is spaced apart from the first electrodes 23 and the first bump electrodes 25 and from the second electrode 27 and the second bump electrode 29.

Referring to FIG. 2, in the light-receiving apparatus 11, the metal body 31 is disposed on the bottom surfaces of the first grooves 37 or the second grooves 39 or both and also on the side surfaces of the semiconductor mesas 33. In the embodiment, the metal body 31 partially or fully fills the grooves. Specifically, the metal body 31 is disposed in a groove (a first groove 37 or a second groove 39) disposed between adjacent semiconductor mesas 33, and extends from a side surface of one of the adjacent semiconductor mesas 33 to a side surface of the other one of the adjacent semiconductor mesas 33 through the bottom surface of the groove, as shown in FIGS. 3A, 3B and 3C. In the portion of the groove in which the metal body 31 is disposed, the groove is filled with the metal body 31. In the present embodiment, the metal body 31 has a multi-layer structure including, for example, an underlying metal layer 31a and a bump metal 31b. The bump metal 31b is disposed on the underlying metal layer 31a. The underlying metal layer 31a is disposed on portions on which the bump metal 31b is disposed, e.g., on the bottom surfaces of the first grooves 37 or the second grooves 39 or both and also on the side surfaces of the semiconductor mesas 33. The underlying metal layer 31a is firmly joined to the bump metal 31b thicker than the underlying metal layer 31a to thereby fix the bump metal 31b to the substrate 21c.

Referring to FIGS. 3A, 3B, and 3C, the metal body 31 is disposed in at least a portion of the first grooves 37 and the second grooves 39. In the present embodiment, the metal body 31 is disposed in both the first grooves 37 and the second grooves 39 so as to form a two-dimensional lattice in at least a portion of the semiconductor structure 21. Preferably, the metal body 31 is made from a single piece of metal member extending from first ends of the first grooves 37 to their second ends and extending from first ends of the second grooves 39 to their second ends.

The metal body 31 in the light-receiving apparatus 11 shown in FIG. 2 has a shape different from the metal body 31 of the light-receiving device array 13 shown in FIGS. 3A, 3B, and 3C. The reason for this is as follows. In a method for producing the light-receiving apparatus 11, after the light-receiving device array 13 is joined to the semiconductor device 15 to produce a product, the first bump electrodes 25, the second bump electrode 29, and also the metal body 31 are subjected to reflow treatment (heat treatment of the product). FIG. 2 shows the metal body 31 after the process of the reflow treatment, and FIGS. 3A, 3B, and 3C show the metal body 31 before the process of the reflow treatment.

The light-receiving device array 13 further includes an inorganic insulating layer 41 that covers a surface of the semiconductor structure 21. The inorganic insulating layer 41 includes a silicon-based inorganic insulating layer formed of, for example, silicon dioxide or silicon nitride or an insulating layer formed of $Al_2O_3$, ZnS, etc. The inorganic insulating layer 41 includes a first portion 41a and a second portion 41b. The first portion 41a covers the side surfaces of the semiconductor mesas 33 and the bottom surfaces of the first grooves 37 and the second grooves 39 within the pixel region 21a. The second portion 41b covers a surface of the peripheral region 21b. The first portion 41a of the inorganic insulating layer 41 has first openings 41c located on the upper surfaces of the semiconductor mesas 33. The first electrodes 23 are in contact with the upper surfaces of the semiconductor mesas 33 through the first openings 41c of the first portion 41a. The second portion 41b of the inorganic insulating layer 41 has second openings 41d located on the first conductive-type semiconductor region 33b. The second electrode 27 is in contact with the upper surface of the first conductive-type semiconductor region 33b through the second openings 41d of the second portion 41b.

The metal body 31 may be disposed on the inorganic insulating layer 41. If possible, the first portion 41a of the inorganic insulating layer 41 may have third openings 41e located on the bottom surfaces of the first grooves 37 and/or the second grooves 39 on which the metal body 31 is disposed. In this case, the metal body 31 is in contact with the upper surface of the first conductive-type semiconductor region 33b through the third openings 41e of the first portion 41a. The metal body 31 is joined to the semiconductor structure 21 and thereby firmly fixed to the semiconductor structure 21. In the present embodiment, as shown in FIGS. 3A, 3B, and 3C, second openings 41d extend in the first and second directions. The second openings 41d extending in the first and second directions may together form a single opening within the peripheral region 21b. The metal body 31 disposed in the pixel region 21a may have a two-dimensional lattice structure. Preferably, in this case, the metal body 31 is joined to the upper surface of the first conductive-type semiconductor region 33b through the third openings 41e arranged in a two-dimensional lattice form.

If necessary, the first electrodes 23, the second electrode 27, and also the underlying metal layer 31a may contain an ohmic metal. To advantageously reduce the number of production steps, the underlying metal layer 31a is formed in one of the step of forming the first electrodes 23 and the step of forming the second electrode 27. The bump metal 31b is formed in one of the step of forming the first bump electrodes 25 and the step of forming the second bump electrode 29.

An example of the light-receiving device array 13.

Substrate 21c: n-type GaSb substrate

Semiconductor stack 21e

First conductive-type semiconductor region 33b: n-type GaSb, n-type InP, or n-type GaAs Optical absorption layer 33a: type II super-lattice such as GaSb/InAs, InGaAs/GaAsSb, or InGaAs/InAlAs Second conductive-type semiconductor region 33c: p-type GaSb, p-type InP, or p-type GaAs First electrodes 23: Ti/Pt/Au/Ni/Au Second electrode 27: Ti/Pt/Au/Ni/Au Underlying metal layer 31a: Ti/Pt/Au/Ni/Au First bump electrodes 25: solder material such as In or AuSn Second bump electrode 29: solder material such as In or AuSn Bump metal 31b: solder material such as In or AuSn Inorganic insulating layer 41: $SiO_2$ and/or SiN Antireflective film 21f disposed on the rear surface of the substrate 21c: SiON, SiN, or $SiO_2$ Referring again to FIG. 2, the semiconductor device 15 includes a plurality of read-out circuits 43, a plurality of signal electrodes 45, and a common electrode 47. The read-out circuits 43 are arranged so as to correspond to the semiconductor mesas 33 arranged in the array. The signal electrodes 45 are disposed on their respective read-out circuits 43. The common electrode 47 is connected to the read-out circuits 43 through wiring members 49. Each of the read-out circuits 43 includes a semiconductor integrated circuit device for processing an electric signal from the pixel array. Specifically, each of the read-out circuits 43 includes a semiconductor device and a circuit that convert a photocurrent from a photodiode including a corresponding semiconductor mesa 33 to a voltage signal and amplify the voltage signal. The semiconductor device 15 is produced, for example, by a method for producing a silicon integrated circuit.

Figure 4A:
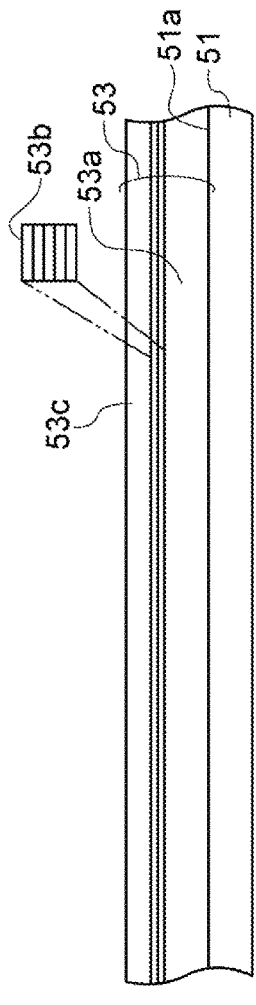
FIGS. 4A, 4B, 4C, and 4D are illustrations showing key steps in a method for producing the light-receiving apparatus and the light-receiving device array according to the embodiment.

FIGS. 4A, 4B, 4C, and 4D to FIGS. 9A, 9B, and 9C are illustrations showing key steps in a method for producing the light-receiving apparatus 11 and the light-receiving device array 13. Referring to FIG. 4A, a stacked semiconductor layer 53 including a plurality of semiconductor layers is grown on a principal surface 51a of a semiconductor substrate 51 by using, for example, a metal-organic vapor phase epitaxy method or a molecular beam epitaxy method. The semiconductor substrate 51 is, for example, an n-type GaSb substrate. In the present embodiment, the stacked semiconductor layer 53 includes a first conductive-type semiconductor layer 53a (e.g., an n-type GaSb layer), a super-lattice structure 53b (e.g., GaSb/InAs) for forming the optical absorption layer, and a second conductive-type semiconductor layer 53c (e.g., a p-type GaSb layer). The stacked semiconductor layer 53 may not include the first conductive-type semiconductor layer 53a. In this case, the super-lattice structure 53b and the second conductive-type semiconductor layer 53c may be sequentially grown on the principal surface 51a of the semiconductor substrate 51. Therefore, part of the semiconductor substrate 51 functions as the first conductive-type semiconductor layer 53a.

Figure 4B:
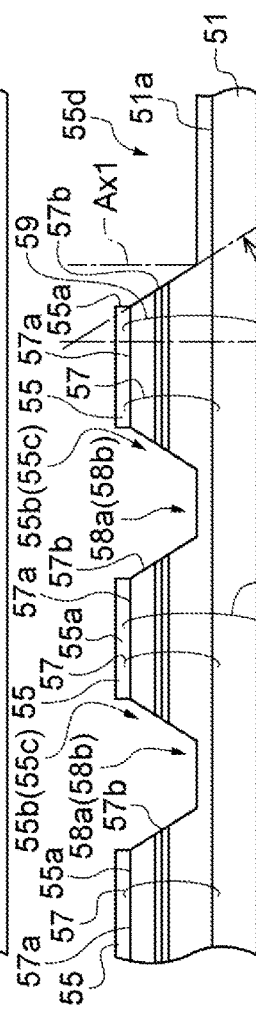

As shown in FIG. 4B, a mask 55 is formed on the stacked semiconductor layer 53. The mask 55 defines the semiconductor mesas, the first grooves, and the second grooves. In the present embodiment, the mask 55 includes a first arrangement pattern 55a that defines the planar shape of the semiconductor mesas in the pixel region. The mask 55 has stripe-shaped first openings 55b for forming the first grooves, stripe-shaped second openings 55c for forming the second grooves, and a third opening 55d. The first openings 55b and the second openings 55c define the first arrangement pattern 55a within the pixel region, and the third opening 55d defines the peripheral region. The mask 55 includes a silicon-based inorganic insulator formed of, for example, SiN. The stacked semiconductor layer 53 is etched using the mask 55 to form a semiconductor structure 59 including an array of semiconductor mesas 57, an array of first grooves 58a, and an array of second grooves 58b. The arrangement direction of the first grooves 58a crosses the arrangement direction of the second grooves 58b. The etching is performed by using one of dry etching method and wet etching method or both of them. After the formation of the semiconductor mesas 57, the first grooves 58a, and the second grooves 58b, the mask 55 is removed. By removing the mask 55, upper surfaces 57a of the semiconductor mesas 57 are exposed.

In the present embodiment, each of the semiconductor mesas 57 has side surfaces 57b inclined with respect to the normal to the principal surface 51a of the semiconductor substrate 51 (or the normal to the upper surface 57a of the semiconductor mesa 57). These inclined side surfaces 57b are provided, for example, using the following etchants and the following etching procedure. To form the inclined side surfaces, both dry etching and wet etching are used.

Etchant for dry etching: gas mixture of hydrogen with a halogen-based gas (e.g., $SiCl_4$, $Cl_2$, or $BCl_4$) and/or a hydrocarbon (such as methane)

Etchant for wet etching: bromine-based etchant (HBr: $H_2O$: $H_2O_2$), citric acid-based etchant (citric acid: phosphoric acid: water), phosphoric acid etchant, etc.

One of dry etching and wet etching or both of them are used. In this etching, the second conductive-type semiconductor layer 53c and the super-lattice structure 53b are etched so that the first conductive-type semiconductor layer 53a is exposed. An etching depth from the upper surface 57a of the semiconductor mesa 57 is about 2 to 3 µm, in the embodiment.

The side surfaces 57b of the semiconductor mesas 57 are inclined. A reference plane (e.g., a cross section in FIG. 4B) orthogonal to the principal surface 51a contains a line REF extending along a side surface of a semiconductor mesa 57, and the line REF forms an angle ANG with a normal axis N×1 that extends in a direction perpendicular to the principal surface 51a of the semiconductor substrate 51. The angle ANG at a halfway point on the side surface of the semiconductor mesa 57 (e.g., at a side surface of the super-lattice structure 53b for forming the optical absorption layer) is preferably within the range of 10 to 45°.

Figure 4C:
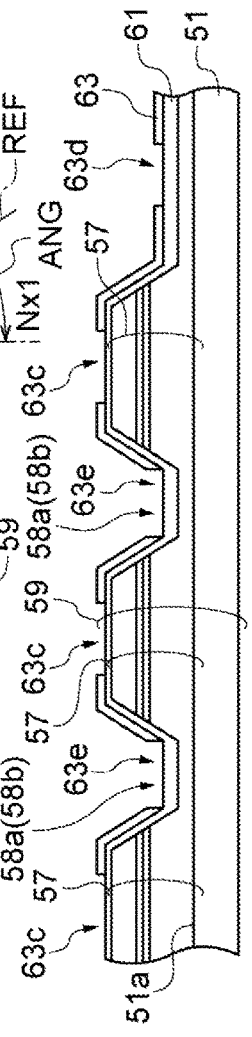

As shown in FIG. 4C, an inorganic insulating layer 61 is formed on a surface of the semiconductor structure 59. To form the inorganic insulating layer 61, a chemical vapor deposition (CVD) method, for example, is used. The inorganic insulating layer 61 contains a silicon-based inorganic insulating material such as silicon dioxide or silicon nitride. A mask 63 having an opening pattern for forming electrodes is formed on the inorganic insulating layer 61. The mask 63 is made of, for example, a resist. The mask 63 has first openings 63c located on the upper surfaces of the semiconductor mesas 57 and second openings 63d located on the peripheral region. If necessary, the mask 63 may have third openings 63e spaced apart from the first openings 63c and from the second openings 63d. The third openings 63e are located on the bottom surfaces of the first grooves 58a or the second grooves 58b or both. The third openings 63e extend over the pixel region along the bottom surfaces of, for example, the first grooves 58a or the second grooves 58b. In the present embodiment, the third openings 63e are formed into a shape corresponding to the two-dimensional lattice pattern of the first grooves 58a and the second grooves 58b. Alternatively, the third openings 63e may be disposed discretely on part of the bottom surfaces of the first grooves 58a and/or the second grooves 58b.

Figure 4D:
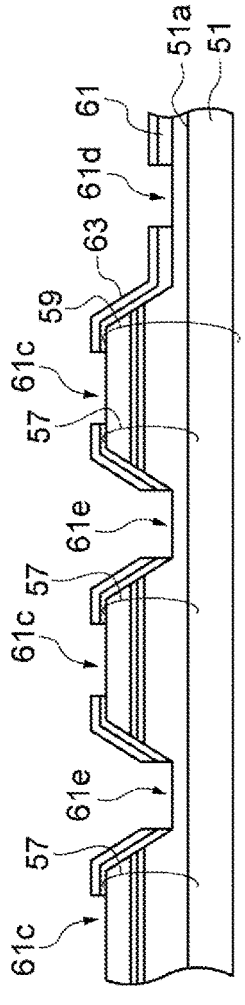

As shown in FIG. 4D, the inorganic insulating layer 61 is etched using the mask 63 to form first openings 61c and second openings 61d in the inorganic insulating layer 61. The inorganic insulating layer 61 has the first openings 61c and the second openings 61d. The inorganic insulating layer 61 also has third openings 61e. The first openings 63c, second openings 63d, and third openings 63e of the mask 63 correspond to the first openings 61c, second openings 61d, and third openings 61e, respectively, of the inorganic insulating layer 61. The first openings 61c, the second openings 61d, and the third openings 61e reach the semiconductor structure 59. The surface of the semiconductor structure 59 is partially exposed through the first openings 61c, the second openings 61d, and the third openings 61e. The third openings 61e allow the underlying metal layer formed in a later step to be joined to the semiconductor structure 59, and this joining causes the underlying metal layer to be firmly fixed to the semiconductor structure 59. The etching used is, for example, dry etching. The etchant used for the etching of the inorganic insulating layer 61 is, for example, a fluorine-based gas (e.g., $CF_4$, or $CHF_3$) or a gas mixture of oxygen with a fluorine-based gas (e.g., $CF_4$, or $CHF_3$). The first openings 61c are located on the upper surfaces 57a of the semiconductor mesas 57 within the pixel region. The second openings 61d are located on the peripheral region outside the pixel region. The third openings 61e are located on the bottom surfaces of the first grooves 58a and/or the second grooves 58b within the pixel region. The third openings 61e may extend along the bottom surfaces of the first grooves 58a or may extend along the bottom surfaces of the second grooves 58b. In the present embodiment, the third openings 61e are formed into a shape corresponding to the two-dimensional lattice pattern of the first grooves 58a and the second grooves 58b. After the formation of the first openings 61c, the second openings 61d, and the third openings 61e, the mask 63 is removed.

Subsequently, a metal layer for forming the first electrodes, the second electrode, and the underlying metal layer is formed. In the present embodiment, the metal layer is formed by using a lift-off method.

Figure 5A:
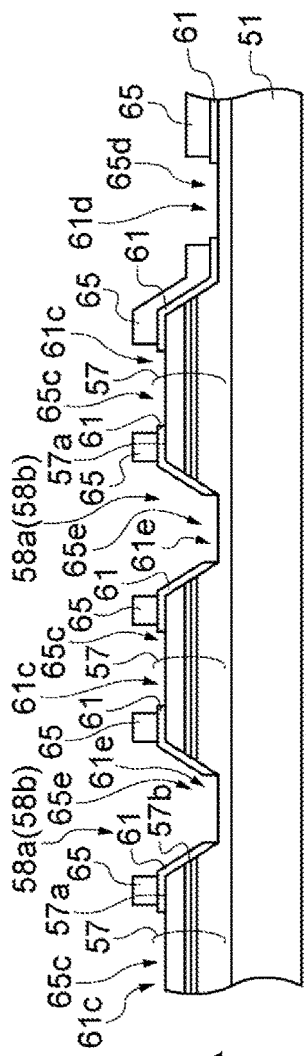
FIGS. 5A, 5B, 5C, and 5D are illustrations showing key steps in the method for producing the light-receiving apparatus and the light-receiving device array according to the embodiment.

As shown in FIG. 5A, a mask 65 that defines the shape of the metal layer for forming the first electrodes, the second electrode, and the underlying metal layer is formed on the semiconductor structure 59 and the inorganic insulating layer 61. The mask 65 has first openings 65c, second openings 65d, and third openings 65e. The first openings 65c, the second openings 65d, and the third openings 65e of the mask 65 are aligned with the first openings 61c, second openings 61d, and third openings 61e, respectively, of the inorganic insulating layer 61. To reliably cover semiconductor surfaces (surfaces of the semiconductor structure 59) exposed within the first openings 61c, second openings 61d, and third openings 61e of the inorganic insulating layer 61 with the metal layer to be formed, the sizes of the first openings 65c, the second openings 65d, and the third openings 65e of the mask 65 are larger than the sizes of the first openings 61c, second openings 61d, and third openings 61e, respectively, of the inorganic insulating layer 61. The edges of the first openings 61c, the second openings 61d, and the third openings 61e of the inorganic insulating layer 61 are present within the first openings 65c, the second openings 65d, and the third openings 65e, respectively, of the mask 65. Specifically, the width of the third openings 65e of the mask 65 is larger than the width of the bottom surfaces of the first grooves 58a and the second grooves 58b within the pixel region. Preferably, in this case, the edges of the third openings 65e of the mask 65 are located on the upper surfaces 57a of the semiconductor mesas 57 or their side surfaces 57b. These third openings 65e of the mask 65 allow the underlying metal layer to be formed not only on the bottom surfaces of the first grooves 58a and the second grooves 58b but also on the side surfaces 57b of the semiconductor mesas 57.

Figure 5B:
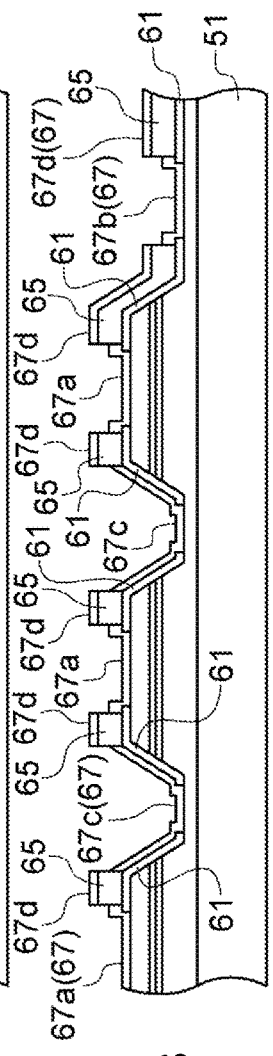

As shown in FIG. 5B, after the formation of the mask 65, the metal layer 67 is formed by using a vacuum evaporation method or a sputtering method. The metal layer 67 (67a, 67b, 67c, and 67d) is formed on the mask 65, the semiconductor structure 59, and the inorganic insulating layer 61. A surplus metal 67d is deposited on the mask 65.

Figure 5C:
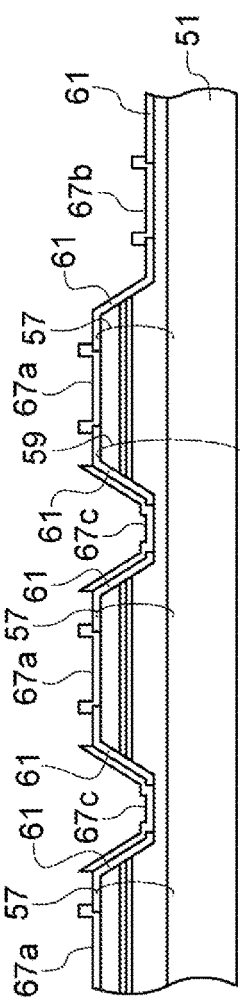

As shown in FIG. 5C, after the formation of the metal layer 67, the mask 65 is removed. The surplus metal 67d thereby disappears in this lift-off process, and first electrodes 67a, a second electrode 67b, and an underlying metal layer 67c are formed. The first electrodes 67a fill the first openings 65c. The edges of the first electrodes 67a are located on the inorganic insulating layer 61 disposed on the upper surfaces 57a of the semiconductor mesas 57. The second electrode 67b fills the second openings 65d. The edges of the second electrode 67b are located on the inorganic insulating layer 61. The underlying metal layer 67c fills the third openings 65e. The underlying metal layer 67c extends along the side surfaces 57b of the semiconductor mesas 57. In this case, the edges of the underlying metal layer 67c are located on the inorganic insulating layer 61 disposed on the upper surfaces 57a of the semiconductor mesas 57.

Figure 5D:
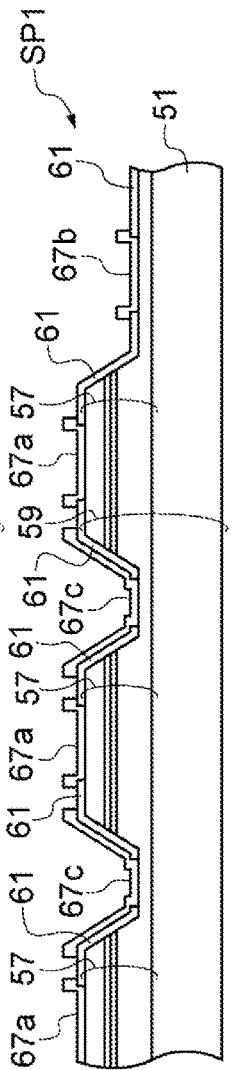

As shown in FIG. 5D, after the formation of the first electrodes 67a, the second electrode 67b, and the underlying metal layer 67c, the rear surface of the semiconductor substrate 51 is polished as needed, and a first product SP1 including the thin semiconductor substrate 51 is thereby formed.

Metal bumps are formed on the first product SP1.

Figure 6A:
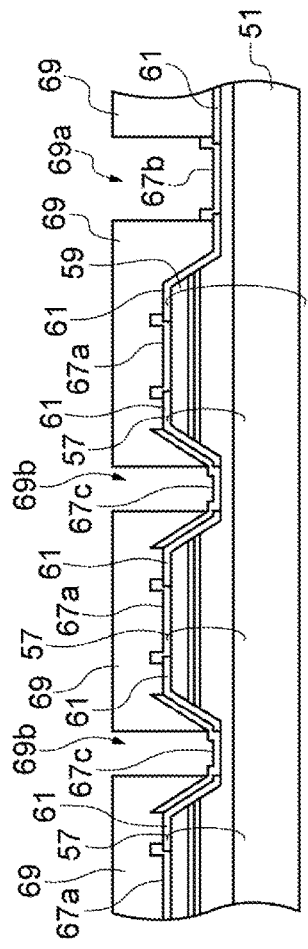
FIGS. 6A, 6B, and 6C are illustrations showing key steps in the method for producing the light-receiving apparatus and the light-receiving device array according to the embodiment.
Figure 6B:
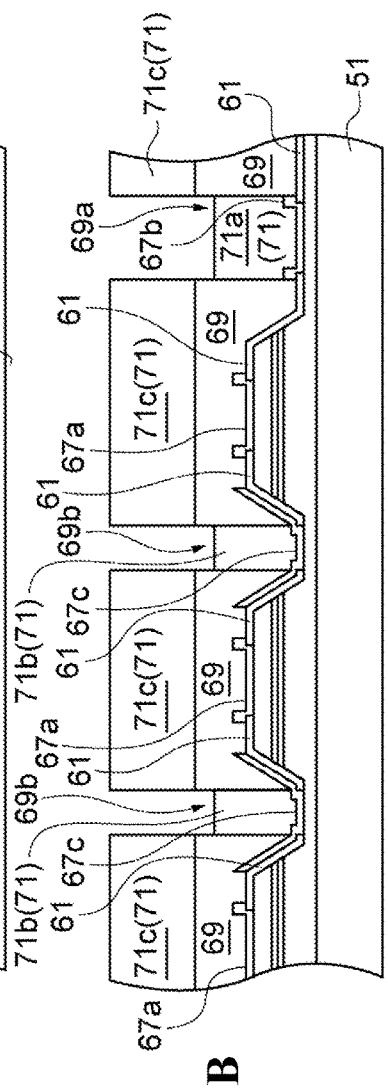
Figure 6C:
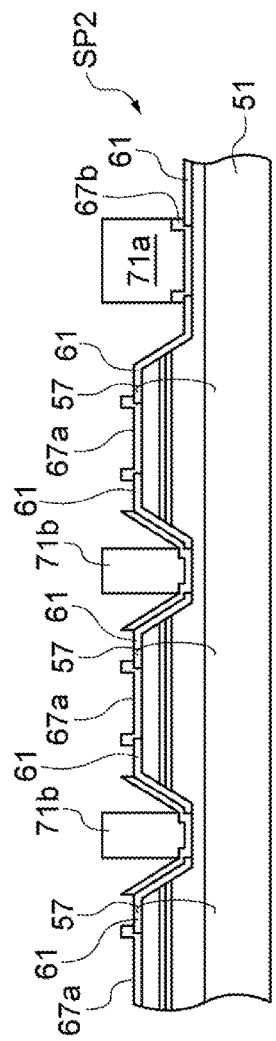

FIGS. 6A, 6B and 6C illustrate a process for forming first metal bumps. As shown in FIG. 6A, a mask 69 is formed. The mask 69 has, for example, a first opening 69a in the peripheral region 21b. The mask 69 also has second openings 69b in the first grooves 58a or the second grooves 58b or both within the pixel region 21a. The mask 69 is formed of, for example, a resist. The second electrode 67b and the underlying metal layer 67c are exposed within the first opening 69a and the second openings 69b, respectively.

As shown in FIG. 6B, a metal layer 71 is deposited on the first product SP1. The metal layer 71 includes a first bump electrode portion 71a, a bump metal 71b and a surplus metal 71c. The first bump electrode portion 71a and the bump metal 71b are formed in the first opening 69a and the second openings 69b, respectively. The surplus metal 71c is deposited on the mask 69. The metal layer 71 is formed of a solder material such as In, AuSn, SnAgCu, PbSn, or PbSnAg. The metal layer 71 is deposited by using a vacuum evaporation method, a sputtering method, or a plating method, for example.

As shown in FIG. 6C, after the deposition of the metal layer 71, the mask 69 is removed. The surplus metal 71c is thereby removed in this lift-off process. The first bump electrode portion 71a and the bump metal 71b remain on the first product SP1. The first product SP1 with the first bump electrode portion 71a and the bump metal 71b mounted thereon is referred to as a second product SP2.

Figure 7A:
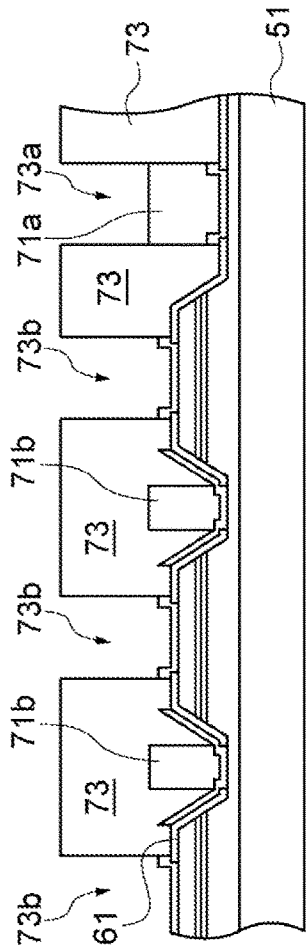
FIGS. 7A, 7B, and 7C are illustrations showing key steps in the method for producing the light-receiving apparatus and the light-receiving device array according to the embodiment.
Figure 7B:
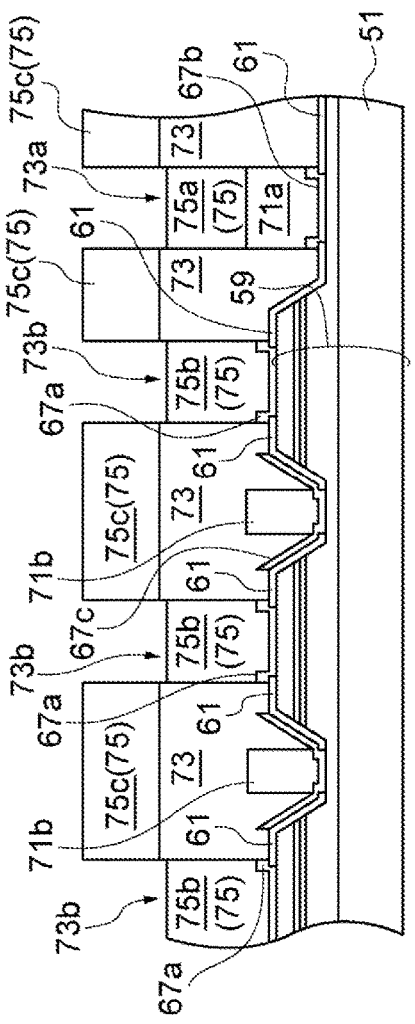
Figure 7C:
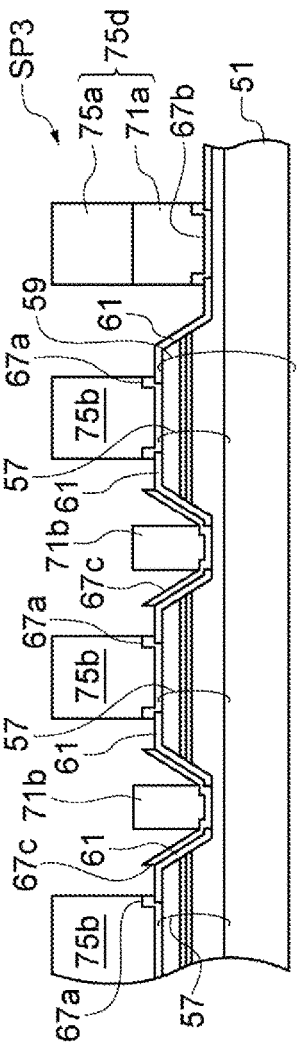

FIGS. 7A, 7B and 7C illustrate a process for forming second metal bumps. As shown in FIG. 7A, a mask 73 is formed on the second product SP2. The mask 73 has, for example, a first opening 73a on the peripheral region 21b and second openings 73b on the upper surfaces of the semiconductor mesas 57 within the pixel region 21a. The mask 73 is formed of, for example, a resist. The first bump electrode portion 71a and the first electrodes 67a are exposed within the first opening 73a and the second openings 73b, respectively.

As shown in FIG. 7B, a metal layer 75 is deposited on the second product SP2. The metal layer 75 includes a second bump electrode portion 75a, a plurality of first bump electrodes 75b and a surplus metal 75c. The second bump electrode portion 75a is formed in the first opening 73a. Each of the first bump electrodes 75b is formed in one of the second openings 73b. The surplus metal 75c is deposited on the mask 73. The metal layer 75 is formed of a solder material such as In, AuSn, SnAgCu, PbSn, or PbSnAg. The metal layer 75 is deposited by using a vacuum evaporation method, a sputtering method, or a plating method, for example.

As shown in FIG. 7C, after the deposition of the metal layer 75, the mask 73 is removed. The surplus metal 75c is thereby removed in this lift-off process. The second bump electrode portion 75a and the first bump electrodes 75b remain on the second product SP2. The first bump electrode portion 71a and the second bump electrode portion 75a that are stacked vertically form a second bump electrode 75d. The second product SP2 with the second bump electrode portion 75a and the first bump electrodes 75b mounted thereon is referred to as a third product SP3.

The steps described above are key steps in the method for producing the light-receiving device array 13. FIG. 8A is a plan view of the third product SP3 shown in FIG. 7C. FIG. 8B is a cross section taken along line VIIIb-VIIIb in FIG. 8A. FIG. 8C is a cross section taken along line VIIIc-VIIIc in FIG. 8A. In the embodiment, a plurality of light-receiving device arrays 13 is formed on a wafer. Referring to FIG. 8A, boundaries SECT between the light-receiving device arrays 13 are shown by broken lines. The third product SP3 is divided to form semiconductor chips of the light-receiving device arrays 13.

The light-receiving device array 13 and the semiconductor device 15 including the read-out circuits are used to produce the light-receiving apparatus 11. First, the light-receiving device array 13 and the semiconductor device 15 are prepared. In the present embodiment, the light-receiving device array 13 is produced in the manner described above, and the light-receiving device array 13 is thereby prepared.

As shown in FIG. 9A, the semiconductor device 15 and the light-receiving device array 13 are prepared. The semiconductor device 15 and the light-receiving device array 13 are aligned with each other, and are brought into contact with each other. And then, the semiconductor device 15 and the light-receiving device array 13 are temporarily compression-bonded while weight is applied. In this case, the semiconductor device 15 and the light-receiving device array 13 may be held at room temperature or may be heated such that their temperature does not exceed the melting point of the metal layer 71 and the metal layer 75. The semiconductor device 15 and the light-receiving device array 13 are aligned with each other such that the first bump electrodes 75b and the second bump electrode 75d come into contact with their respective electrodes in the semiconductor device 15. When heights of the bump metal 71b, the second bump electrode 75d, and the first bump electrodes 75b disposed on the upper surfaces of the semiconductor mesas 57 are measured from the principal surface 51a of the semiconductor substrate 51 in a thickness direction, the height of the bump metal 71b is smaller than the height of the second bump electrode 75d and is smaller than the height of the first bump electrodes 75b. The bump metal 71b is not in contact with the first bump electrodes 75b and the second bump electrode 75d of the light-receiving device array 13. In addition, the bump metal 71b is not in contact with the electrodes of the semiconductor device 15. In the embodiment, the underlying metal layer 67c and the bump metal 71b disposed on the underlying metal layer 67c constitute the metal body. As a result, the height of the metal body measured from the principal surface 51a of the semiconductor substrate 51 in the thickness direction is smaller than the height of the second bump electrode 75d and is smaller than the height of the first bump electrodes 75b. The metal body is not in contact with the first and second bump electrodes (75b and 75d) of the light-receiving device array 13, and the metal body is not in contact with the electrodes of the semiconductor device 15. If necessary, the bump electrodes may be formed in advance on the electrodes of the semiconductor device 15.

As shown in FIG. 9B, the semiconductor device 15 and the light-receiving device array 13 aligned with each other are subjected to heat treatment with the semiconductor device 15 and the light-receiving device array 13 in contact with each other. Reflow treatment is used as the heat treatment for joining the semiconductor device 15 and the light-receiving device array 13. In the reflow step, the heat treatment is performed at a temperature higher than the melting point of the metal layer 71 and the metal layer 75. As a result of the heat treatment, the semiconductor device 15 and the light-receiving device array 13 are firmly joined to each other through the metal. Moreover, the first bump electrodes 75b, the second bump electrode 75d, and the bump metal 71b are deformed as a result of the joining of the semiconductor device 15 and the light-receiving device array 13 after the heat treatment in the reflow step.

As shown in FIG. 9C, a resin is injected into the space between the semiconductor device 15 and the light-receiving device array 13 joined to each other. The semiconductor device 15, the light-receiving device array 13, and the resin are subjected to heat treatment for curing the resin. The resin is thereby cured, and the underfill 17 is formed. The resin includes, for example, an epoxy-based resin.

The light-receiving apparatus 11 converts light incident on the rear surface of the light-receiving device array 13 to an electric signal. The electric signal provided from the light-receiving apparatus 11 may be reproduced into a two-dimensional image. The light-receiving device array 13 has sensitivity to light with an infrared wavelength. To reduce noise or a dark current of the photodiodes in the light-receiving device array 13, the light-receiving apparatus 11 is operated at a temperature lower than room temperature, e.g., at a temperature equal to or lower than liquid nitrogen temperature (the boiling point of liquid nitrogen). Since the light-receiving apparatus 11 is used at low temperature, it is cooled to its operating temperature and then returned to room temperature after use. The light-receiving device array 13, the semiconductor device 15, and the underfill 17 are each subjected to thermal stress due to the difference in their thermal expansion coefficients during temperature change. Among the light-receiving device array 13, the semiconductor device 15, and the underfill 17, the resin-made underfill 17 has a larger thermal expansion coefficient than the others. The bump metal 71b is disposed in the pixel region of the light-receiving device array 13. Specifically, the bump metal 71b is partially or entirely disposed in the first grooves 58a or the second grooves 58b or both to fill the grooves. In the portions of the pixel region on which the bump metal 71b is disposed, the thickness of the underfill 17 is reduced. The bump metal 71b in the pixel region prevents thick portions of the underfill 17 from extending over long distances.

Figure 10:
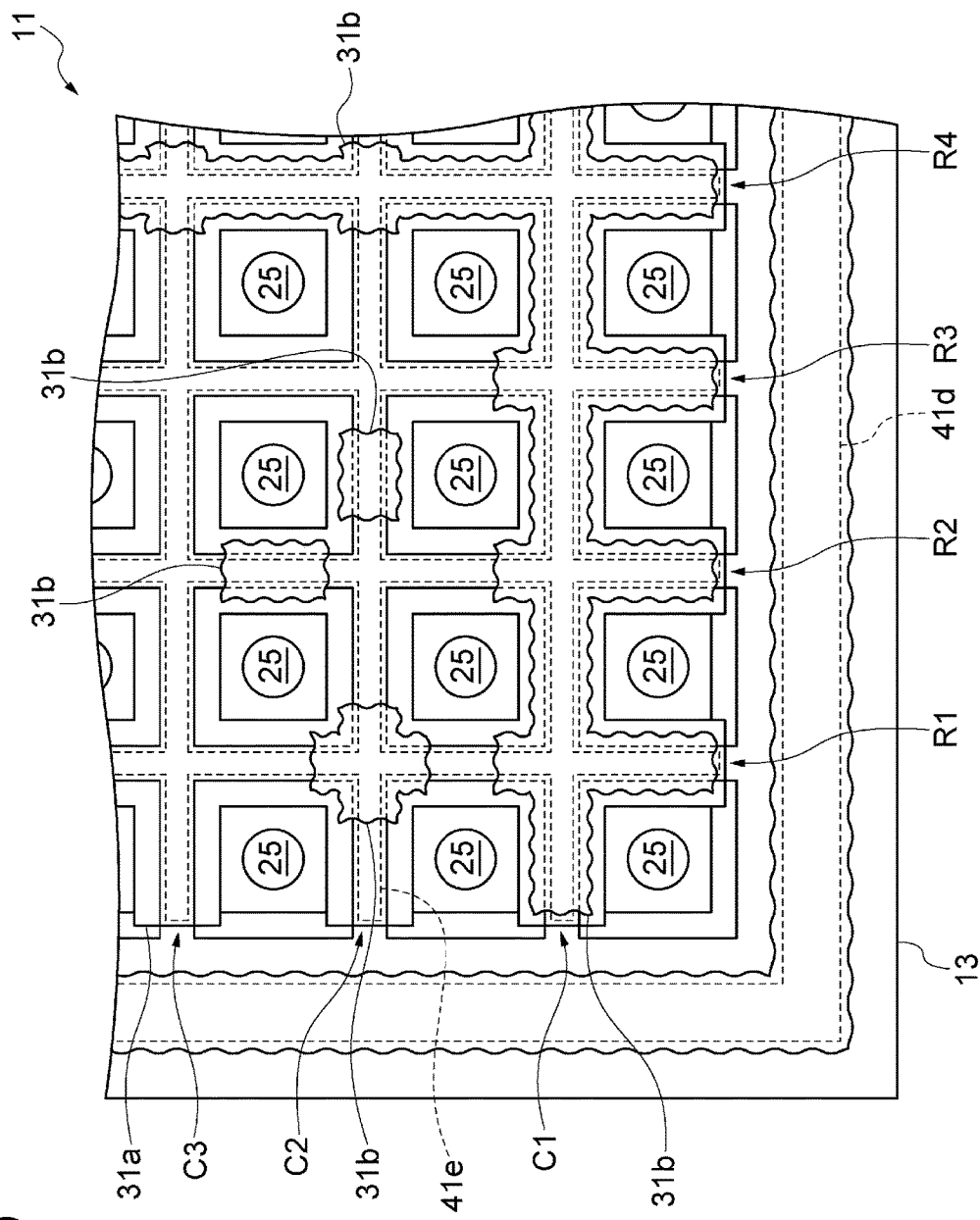
FIG. 10 is a plan view showing the light-receiving device array according to the embodiment.

FIG. 10 is a plan view showing a light-receiving device array according to different embodiments. The front surface of the light-receiving device array 13 in the light-receiving apparatus 11 is shown. The arrangement of the metal body 31 is not limited to the shape in the light-receiving device array described above. Referring to FIG. 10, the third openings 41e of the inorganic insulating layer 41 are disposed on the bottom surfaces of row and column grooves defining the semiconductor mesas 33 arranged in a two-dimensional array and are arranged in a two-dimensional lattice form. The underlying metal layer 31a of the metal body 31 is disposed so as to cover the third openings 41e. Specifically, light-receiving device arrays according to other embodiments may have the following structures.

The third openings 41e of the inorganic insulating layer 41 may be disposed on the bottom surfaces of grooves (C1, C2, and C3) so as to extend in the direction of the rows of the semiconductor mesas 33. The bump metal 31b of the metal body 31 may be disposed along grooves (e.g., the groove C1) extending in the direction of the rows of the semiconductor mesas 33.

The third openings 41e of the inorganic insulating layer 41 may be disposed on the bottom surfaces of grooves (R1, R2, and R3) so as to extend in the direction of the columns of the semiconductor mesas 33. The bump metal 31b of the metal body 31 may be disposed along grooves (e.g., a groove R4) extending in the direction of the columns of the semiconductor mesas 33.

The bump metal 31b of the metal body 31 may be disposed at the intersections of grooves (e.g., the groove R1) extending in the direction of the columns of the semiconductor mesas 33 and grooves (e.g., the groove C2) extending in the direction of the rows of the semiconductor mesas 33.

The bump metal 31b of the metal body 31 may be disposed in grooves (e.g., R2) between adjacent semiconductor mesas 33. The bump metal 31b of the metal body 31 may be disposed in grooves (e.g., C2) between adjacent semiconductor mesas 33. The metal body 31 that partially fills grooves between adjacent semiconductor mesas 33 may reduce the length of thick portions of the underfill 17.

While the principle of the present invention has been described in the preferred embodiments, it will be appreciated by those skilled in the art that changes can be made to the arrangement and details of the present invention without departing from the principle. The present invention is not limited to the specific configurations disclosed in the embodiments. Therefore, the applicant claims all modifications and changes falling within the claims and the scope of spirit thereof.

What is claimed is:

1. A light-receiving apparatus comprising:
a light-receiving device array including a semiconductor structure having a pixel region and a peripheral region different from the pixel region, the pixel region including a plurality of semiconductor mesas, a plurality of grooves defining the semiconductor mesas, a plurality of first electrodes, a plurality of first bump electrodes, and a metal body, the semiconductor mesas each having an upper surface and side surfaces, at least one of the grooves having a bottom surface, the first electrodes being disposed on the upper surfaces of the semiconductor mesas, the first bump electrodes being disposed on the first electrodes, the metal body being disposed on the bottom surface of the at least one of the grooves, the metal body being spaced apart from the first electrodes and the first bump electrodes;
a semiconductor device processing an electric signal provided from the light-receiving device array, the semiconductor device having a surface; and
an underfill disposed between the light-receiving device array and the semiconductor device,
wherein the metal body is spaced apart from the surface of the semiconductor device and includes an underlying metal layer and a bump metal that is disposed on the underlying metal layer, the underlying metal layer being disposed on the bottom surface of the at least one of the grooves, and
wherein the semiconductor device is joined to the light-receiving device array through the first bump electrodes.

2. The light-receiving apparatus according to claim 1, further comprising an insulating layer disposed on the semiconductor structure,
the insulating layer having an opening at the upper surface of each of the semiconductor mesas,
each of the first electrodes being disposed in a respective one of the openings of the insulating layer, and
the first electrodes being in contact with the upper surfaces of the semiconductor mesas through the openings.

3. The light-receiving apparatus according to claim 1, further comprising an insulating layer disposed on the semiconductor structure, wherein
the semiconductor structure in the peripheral region includes an upper surface a second electrode, and a second bump electrode disposed on the second electrode, the second electrode being electrically connected to the semiconductor mesas,
the insulating layer has an opening in the peripheral region,
the second electrode is disposed in the opening of the insulating layer and
the second electrode is in contact with the upper surface of the semiconductor structure in the peripheral region through the opening of the insulating layer.

4. The light-receiving apparatus according to claim 3, wherein the first electrodes serve as one of an anode electrode and a cathode electrode, and
the second electrode serves as the other of an anode electrode and a cathode electrode.

5. The light-receiving apparatus according to claim 1, wherein the semiconductor structure further includes a substrate having a principal surface, the substrate disposing the semiconductor mesas thereon,
the semiconductor mesas including optical absorption layers, and
wherein the metal body has a height measured from the principal surface of the substrate in a thickness direction smaller than a height of the first bump electrodes measured from the principal surface of the substrate in the thickness direction.

6. A light-receiving apparatus comprising:
a light-receiving device array including a semiconductor structure having a pixel region and a peripheral region different from the pixel region, the pixel region including a plurality of semiconductor mesas, a plurality of grooves defining the semiconductor mesas, a plurality of first electrodes, a plurality of first bump electrodes, and metal bodies, the semiconductor mesas each having an upper surface and side surfaces, the grooves each having j bottom surface, the first electrodes being disposed on the upper surfaces of the semiconductor mesas, the first bump electrodes being disposed on the first electrodes, the metal bodies being disposed on the bottom surfaces of the grooves, and each metal body being spaced apart from the first electrodes and the first bump electrodes;

a semiconductor device processing an electric signal provided from the light-receiving device array, the semiconductor device having a surface;

an underfill disposed between the light-receiving device array and the semiconductor device, and an insulating layer disposed on the semiconductor structure, wherein the insulating layer has one or a plurality of openings at the bottom surfaces of the grooves, wherein each metal body is disposed in a respective opening of the insulating layer, connected to the semiconductor structure in the pixel region through its respective opening of the insulating layer, and spaced apart from the surface of the semiconductor device, and wherein the semiconductor device is joined to the light-receiving device array by the first bump electrodes.

7. The light-receiving apparatus according to claim 6, wherein the grooves include at least one first groove extending in a first direction and at least one second groove extending in a second direction that crosses the first direction, and wherein one of the metal bodies disposed in the opening of the insulating layer at the bottom surface of the at least one first groove extends in the first direction, and another one of the metal bodies disposed in the opening of the insulating layer at the bottom surface of the second groove extends in the second direction.

8. A light-receiving device array comprising:

a substrate including a pixel region and a peripheral region different from the pixel region;

a plurality of semiconductor mesas disposed on the substrate in the pixel region, the semiconductor mesas each having an upper surface and side surfaces;

a plurality of grooves defining the semiconductor mesas, at least one of the grooves having a bottom surface;

a plurality of first electrodes disposed on the upper surfaces of the semiconductor mesas;

a plurality of first bump electrodes disposed on the first electrodes; and a metal body disposed on the bottom surface of the at least one of the grooves, the metal body including an underlying metal layer and bump metal disposed on the underlying metal layer, the underlying metal layer being disposed on the bottom surface of the at least one of the grooves and on the side surfaces of semiconductor mesas next to the at least one of the grooves, wherein the metal body has a thickness greater than thicknesses of the first electrodes, and the metal body is spaced apart from the first electrodes and the first bump electrodes.

9. The light-receiving device array according to claim 8, further comprising an insulating layer disposed on the semiconductor mesas, the insulating layer having openings at the semiconductor mesas, wherein the first electrodes are disposed in the openings of the insulating layer, and are in contact with the upper surfaces of the semiconductor mesas through the opening openings of the insulating layer.

10. The light-receiving device array according to claim 8, further comprising:

an insulating layer disposed on the substrate in the peripheral region, the insulating layer having an opening;

a second electrode disposed in the opening and in contact with an upper surface of the substrate through the opening; and a second bump electrode disposed on the second electrode, wherein the second electrode is electrically connected to the semiconductor mesas.

11. The light-receiving device array according to claim 10, wherein the first electrodes serve as one of an anode electrode and a cathode electrode, and the second electrode serves as the other of an anode electrode and a cathode electrode.

12. The light-receiving device array according to claim 8, further comprising a plurality of metal bodies and an insulating layer, wherein each of the grooves has a bottom surface with one of the metal bodies provided thereon, wherein the insulating layer has a plurality of openings, wherein each metal body is disposed in one of the openings of the insulating layer, and wherein e metal body is connected to the substrate through the opening of the insulating layer in which it is disposed.

13. The light-receiving device array according to claim 12, wherein the grooves include at least one first groove extending in a first direction and at least one second groove extending in a second direction that crosses the first direction, wherein the metal body disposed in the opening of the insulating layer at the bottom surface of the at least one first groove extends in the first direction, and the metal body disposed in the opening of the insulating layer at the bottom surface of the at least one second groove extends in the second direction.

14. The light-receiving device array according to claim 8, wherein the metal body has a height measured from a principal surface of the substrate in a thickness direction that is smaller than heights of the first bump electrodes measured from the principal surface of the substrate in the thickness direction.

* * * * *